(12) United States Patent
Zhang

(10) Patent No.: US 11,211,561 B2
(45) Date of Patent: Dec. 28, 2021

(54) DISPLAY PANEL AND MANUFACTURING METHOD THEREOF, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventor: Jinzhong Zhang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 78 days.

(21) Appl. No.: 16/527,091

(22) Filed: Jul. 31, 2019

(65) Prior Publication Data

US 2020/0044153 A1    Feb. 6, 2020

(30) Foreign Application Priority Data

Aug. 2, 2018   (CN) .......................... 201810870035.9

(51) Int. Cl.
 *B32B 43/00*  (2006.01)
 *H01L 51/00*  (2006.01)
 *B32B 38/10*  (2006.01)

(52) U.S. Cl.
 CPC ............ *H01L 51/003* (2013.01); *B32B 38/10* (2013.01); *B32B 43/006* (2013.01); *H01L 51/0011* (2013.01)

(58) Field of Classification Search
 CPC ... B32B 38/10; B32B 43/006; Y10T 156/1111
 See application file for complete search history.

(56) References Cited

U.S. PATENT DOCUMENTS

| | | | | |
|---|---|---|---|---|
| 5,447,596 A | * | 9/1995 | Hayase | H01L 21/6835 156/701 |
| 5,624,521 A | * | 4/1997 | Hed | B23Q 3/08 156/154 |
| 5,800,665 A | * | 9/1998 | Okaniwa | B32B 43/00 134/104.3 |

(Continued)

FOREIGN PATENT DOCUMENTS

| CN | 1776884 A | 5/2006 |
|---|---|---|
| CN | 102760846 A | 10/2012 |

OTHER PUBLICATIONS

First office action of Chinese application No. 201810870035.9 dated Oct. 28, 2019.

*Primary Examiner* — Mark A Osele
*Assistant Examiner* — Nickolas R Harm
(74) *Attorney, Agent, or Firm* — Fay Sharpe LLP

(57) ABSTRACT

The present disclosure discloses a display panel and a manufacturing method thereof, and a display device, and belongs to the field of display technology. The method includes: fixing a base substrate on a supporting plate; disposing the supporting plate on which the base substrate is fixed at a specified position in a process apparatus; and performing a process corresponding to the process apparatus on the base substrate which is fixed on the supporting plate by means of the process apparatus.

12 Claims, 6 Drawing Sheets

(56) References Cited

U.S. PATENT DOCUMENTS

| | | | | |
|---|---|---|---|---|
| 6,066,229 | A * | 5/2000 | Komine | B29C 63/0013 |
| | | | | 156/718 |
| 2002/0104616 | A1* | 8/2002 | De | H01L 21/67132 |
| | | | | 156/701 |
| 2004/0188861 | A1* | 9/2004 | Kurimoto | H01L 24/27 |
| | | | | 257/786 |
| 2005/0173064 | A1* | 8/2005 | Miyanari | H01L 21/6835 |
| | | | | 156/703 |
| 2006/0108050 | A1* | 5/2006 | Satake | B32B 7/06 |
| | | | | 156/101 |
| 2011/0048611 | A1* | 3/2011 | Carre | H01L 21/6836 |
| | | | | 156/73.1 |
| 2013/0043065 | A1 | 2/2013 | Park et al. | |
| 2014/0062902 | A1* | 3/2014 | Han | G06F 3/0412 |
| | | | | 345/173 |
| 2014/0150967 | A1* | 6/2014 | Kurimura | C09D 4/00 |
| | | | | 156/275.5 |
| 2016/0133486 | A1* | 5/2016 | Andry | B32B 43/006 |
| | | | | 428/40.4 |
| 2016/0189996 | A1* | 6/2016 | Tanabe | C08L 83/00 |
| | | | | 428/354 |

* cited by examiner

DISPLAY PANEL AND MANUFACTURING METHOD THEREOF, AND DISPLAY DEVICE

CROSS-REFERENCE TO RELATED APPLICATION

This application claims priority to Chinese Patent Application No. 201810870035.9, filed on Aug. 2, 2018 and entitled "DISPLAY PANEL ANT) MANUFACTURING METHOD THEREOF, AND DISPLAY DEVICE" the entire contents of which are incorporated herein by reference.

TECHNICAL FIELD

The present disclosure relates to the field of display technology, and particularly relates to a display panel and a manufacturing method thereof, and a display device.

BACKGROUND

A display panel generally includes a base substrate and various devices disposed on the base substrate. At present, in the process of manufacturing a display panel, the base substrate is usually transferred to various process apparatuses (such as various evaporating platers), so as to form various devices on the base substrate by means of various processes.

In a method for manufacturing the display panel, the base substrate is placed in the process apparatus by means of a robot arm, and a fixing frame in the process apparatus can fix the base substrate on a fixing plate at a specified position in the process apparatus, so as to facilitate the process apparatus to perform a process corresponding thereto on the base substrate. Thereafter, the fixing frame releases the base substrate which is then transferred to another process apparatus by means of the robot arm.

SUMMARY

The embodiments of the present disclosure provide a display panel and a manufacturing method thereof, and a display device, and the technical solution is as follows.

According to an aspect of the present disclosure, there is provided a method for manufacturing a display panel. The method comprises:

fixing a base substrate on a supporting plate;

disposing the supporting plate on which the base substrate is fixed at a specified position in a process apparatus; and performing a process corresponding to the process apparatus on the base substrate which is fixed on the supporting plate by means of the process apparatus.

Optionally, disposing the supporting plate on which the base substrate is fixed at a specified position in a process apparatus comprises:

fixing the supporting plate on which the base substrate is fixed at the specified position in the process apparatus by means of a fixing frame in the process apparatus.

Optionally, an edge of the supporting plate is provided with a clamping groove, and before fixing the supporting plate on which the base substrate is fixed at the specified position in the process apparatus by means of the fixing frame in the process apparatus, the method further comprises:

engaging the fixing frame with the clamping groove.

Optionally, fixing the base substrate on the supporting plate comprises:

adhering the base substrate onto the supporting plate.

Optionally, adhering the base substrate onto the supporting plate comprises:

providing an adhesive on the supporting plate; and placing the base substrate on the supporting plate which is provided with the adhesive so that the base substrate is adhered onto the supporting plate.

Optionally, after performing a process corresponding to the process apparatus on the base substrate which is fixed on the supporting plate by means of the process apparatus, the method further comprises:

dissolving the adhesive by means of a dissolving solution; and separating the base substrate from the supporting plate.

Optionally, the adhesive is any one of a light curing adhesive and a heat curing adhesive, and placing the base substrate on the supporting plate which is provided with the adhesive so that the base substrate is adhered onto the supporting plate comprises:

placing the base substrate on the supporting plate which is provided with the adhesive; and curing the adhesive to adhere the base substrate onto the supporting plate.

Optionally, the adhesive is distributed throughout a region which is occupied by the base substrate on the supporting plate.

Optionally, the adhesive comprises a curved adhesive pattern.

Optionally, the curved adhesive pattern is an open pattern.

Optionally, dissolving the adhesive by means of the dissolving solution comprises:

packaging the base substrate which is fixed on the supporting plate by means of a packaging process to form a display panel; and placing the supporting plate and the display panel into the dissolving solution to dissolve the adhesive.

Optionally, after performing a process corresponding to the process apparatus on the base substrate which is fixed on the supporting plate by means of the process apparatus, the method further comprises:

removing the base substrate on which the process corresponding to the process apparatus is performed and the supporting plate from the process apparatus.

Optionally, the process apparatus is an evaporating plater, and before disposing the supporting plate on which the base substrate is fixed at a specified position in a process apparatus, the method further comprises:

adjusting a position of the supporting plate so that a side of the supporting plate on which the base substrate is disposed faces ground.

Optionally, adhering the base substrate onto the supporting plate comprises:

providing an adhesive on the supporting plate, wherein the adhesive is any one of a light curing adhesive and a heat curing adhesive, the adhesive is distributed throughout a region which is occupied by the base substrate on the supporting plate, and the adhesive comprises a curved adhesive pattern which is an open pattern;

placing the base substrate on the supporting plate which is provided with the adhesive; and curing the adhesive to adhere the base substrate onto the supporting plate;

wherein the process apparatus is an evaporating plater, and before disposing the supporting plate on which the base substrate is fixed at a specified position in a process apparatus, the method further comprises:

adjusting a position of the supporting plate so that a side of the supporting plate on which the base substrate is disposed faces ground;

wherein an edge of the supporting plate is provided with a clamping groove, and disposing the supporting plate on which the base substrate is fixed at a specified position in a process apparatus comprises:

engaging a fixing frame in the process apparatus with the clamping groove; and fixing the supporting plate on which the base substrate is fixed at the specified position in the process apparatus by means of the fixing frame;

wherein after performing a process corresponding to the process apparatus on the base substrate which is fixed on the supporting plate by means of the process apparatus, the method further comprises:

packaging the base substrate which is fixed on the supporting plate by means of a packaging process to form a display panel; and placing the supporting plate and the display panel into a dissolving solution to dissolve the adhesive.

According to another aspect of the present disclosure, there is provided a display panel manufactured by a method for manufacturing a display panel, and the method comprises:

fixing a base substrate on a supporting plate;

disposing the supporting plate on which the base substrate is fixed at a specified position in a process apparatus; and performing a process corresponding to the process apparatus on the base substrate which is fixed on the supporting plate by means of the process apparatus.

Optionally, an edge of the supporting plate is provided with a clamping groove, and disposing the supporting plate on which the base substrate is fixed at a specified position in a process apparatus comprises:

engaging a fixing frame in the process apparatus with the clamping groove; and fixing the supporting plate on which the base substrate is fixed at the specified position in the process apparatus by means of the fixing frame According to still another aspect of the present disclosure, there is provided a display device comprising a display panel, wherein the display panel is manufactured by a method for manufacturing a display panel, and the method comprises:

fixing a base substrate on a supporting plate;

disposing the supporting plate on which the base substrate is fixed at a specified position in a process apparatus; and performing a process corresponding to the process apparatus on the base substrate which is fixed on the supporting plate by means of the process apparatus.

DETAILED DESCRIPTION

Embodiments of the present disclosure will be described below with reference to the accompanying drawings.

In the process of manufacturing a display panel, a base substrate is usually transferred to the process apparatuses sequentially in accordance with the manufacturing flow route, and each of the process apparatuses can perform a process corresponding thereto on the base substrate. For example, an evaporating plater can form various film structures on the base substrate by means of an evaporation process.

At present, the base substrate is usually moved to the process apparatus by means of a robot arm, and then the base substrate is fixed on a fixing plate at a specified position in the process apparatus (the specified position is the position at which the fixing plate is located in the process apparatus) by means of a fixing frame in the process apparatus.

Figure 1:
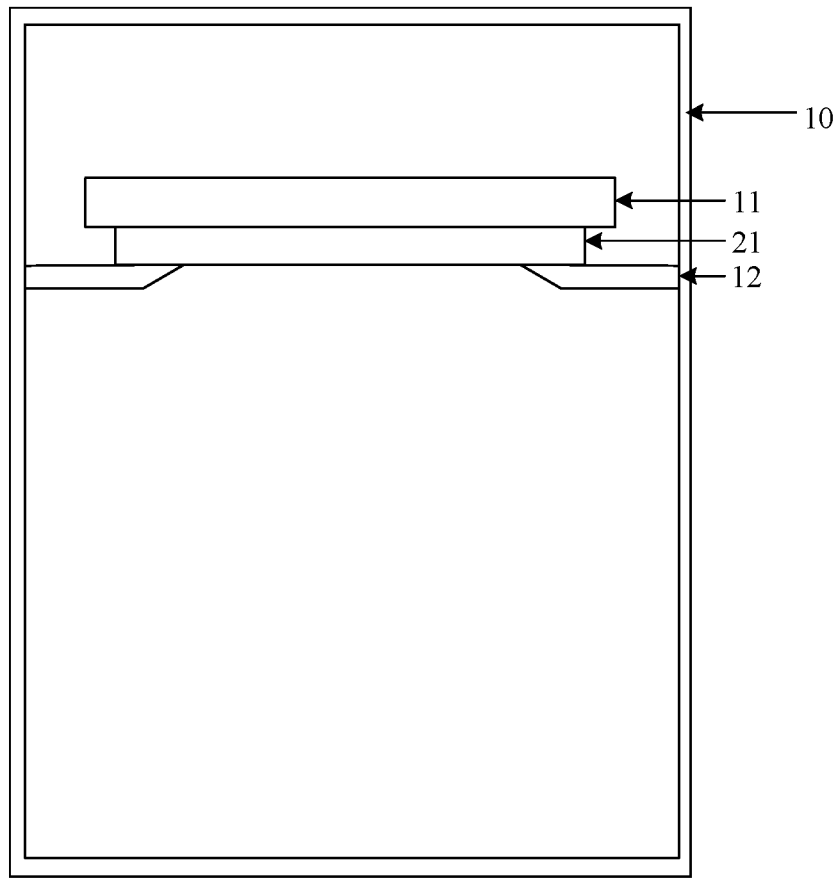
FIG. 1 is a schematic structural diagram of a process apparatus and a base substrate.

Exemplarily, FIG. 1 is a schematic structural diagram of a base substrate 21 in a process apparatus 10. A fixing plate 11 is fixed at a specified position (not shown in FIG. 1) in the process apparatus 10, and a fixing frame 12 fixes the base substrate 21 on the fixing plate 11.

However, in the above method for manufacturing the display panel, it is necessary to frequently disassemble and assemble the base substrate from and onto the fixing plate in the process apparatus. On one hand, this may damage the base substrate in the course of disassembly and assembly, and on the other hand, it may be difficult to separate the base substrate from the fixing plate due to static electricity.

Figure 2:
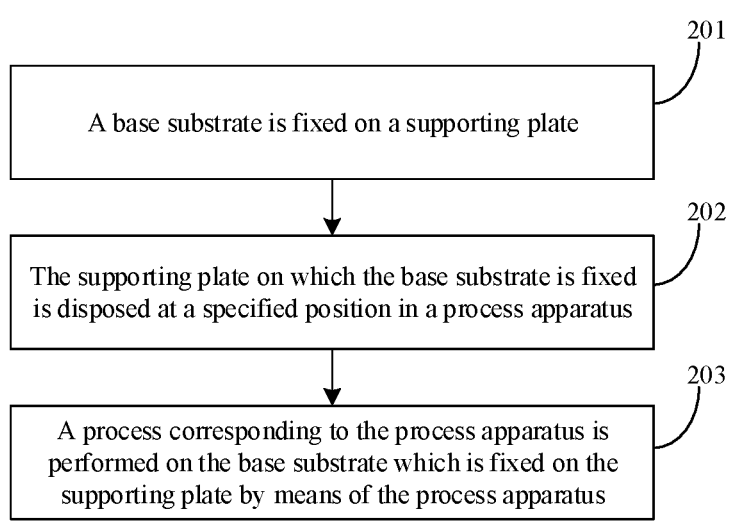
FIG. 2 is a flow chart of a method for manufacturing a display panel according to an embodiment of the present disclosure.

FIG. 2 is a flow chart of a method for manufacturing a display panel according to an embodiment of the present disclosure. The method for manufacturing the display panel may include the following steps.

In step 201, a base substrate is fixed on a supporting plate.

In step 202, the supporting plate on which the base substrate is fixed is disposed at a specified position in a process apparatus.

In step 203, a process corresponding to the process apparatus is performed on the base substrate which is fixed on the supporting plate by means of the process apparatus.

In summary, with respect to the method for manufacturing the display panel according to the embodiment of the present disclosure, the base substrate is fixed on the supporting plate, and the supporting plate and the base substrate are transferred together into the process apparatus, so that it is not necessary for the base substrate to fix onto and separate from the fixing plate in the process apparatus, which solves the problem in the related art that, the process of fixing the base substrate onto the fixing plate in the process apparatus and the process of separating the base substrate from the fixing plate in the process apparatus may damage the base substrate, which may result in a low yield of the display panel. Thus, the yield of the display panel may be improved.

Figure 3:
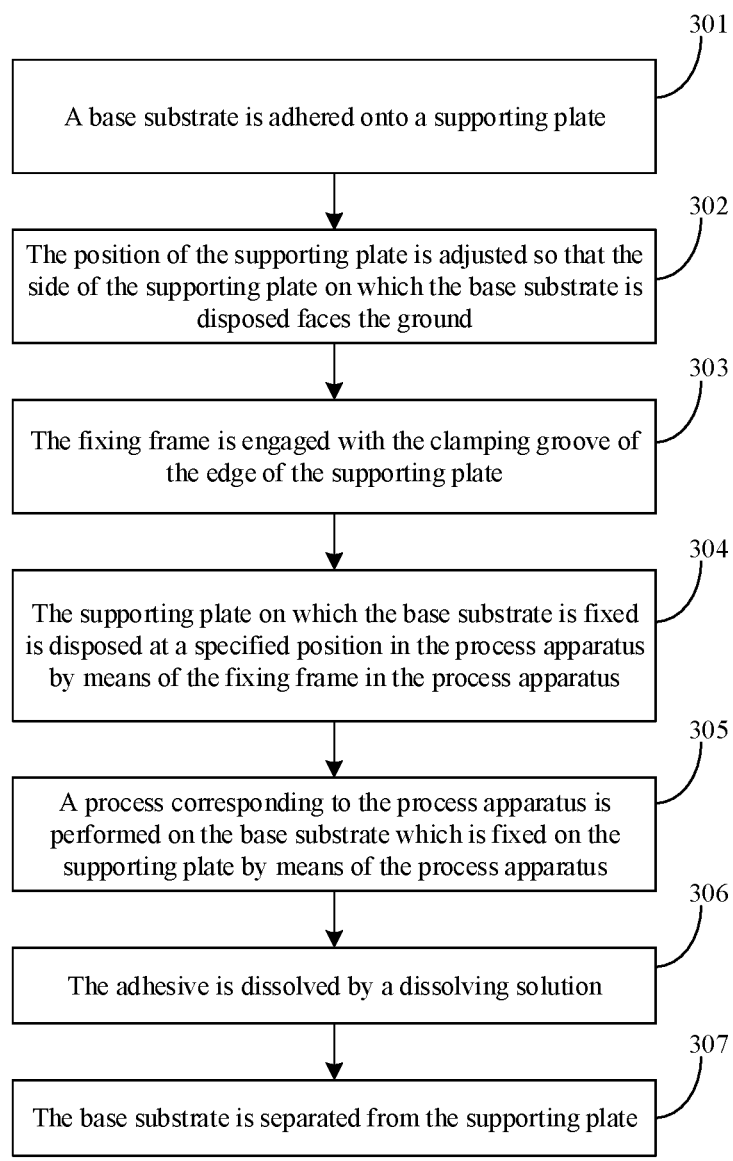
FIG. 3 is a flow chart of another method for manufacturing a display panel according to an embodiment of the present disclosure.

FIG. 3 is a flow chart of another method for manufacturing a display panel according to an embodiment of the present disclosure. The method for manufacturing the display panel may include the following steps.

In step 301, a base substrate is adhered onto a supporting plate.

Figure 4:
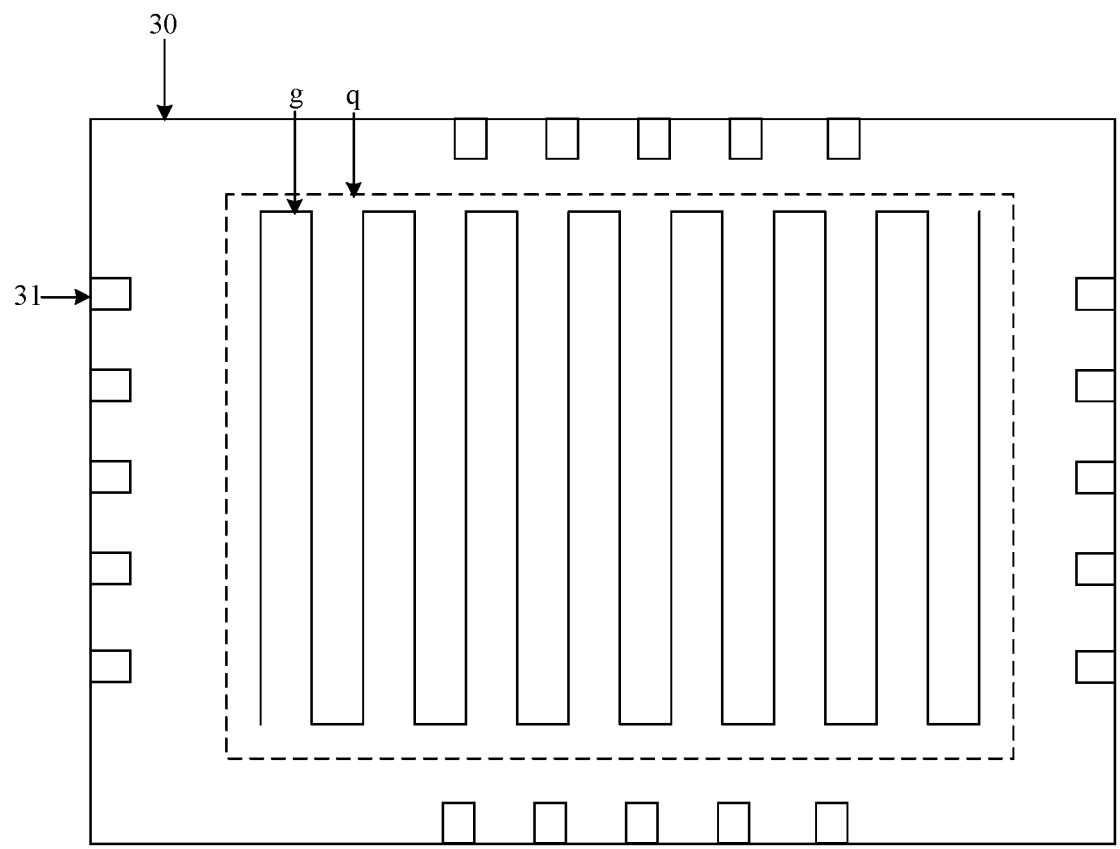
FIG. 4 is a schematic structural diagram of a supporting plate in the embodiment shown in FIG. 3.

The structure of the supporting plate may be as shown in FIG. 4. The edge of the supporting plate 30 can be provided with a clamping groove 31 for engaging with a fixing frame in a process apparatus, so that not only the damage to the base substrate due to the direct contact of the fixing frame and the base substrate can be avoided, but also the stability between the fixing frame in the process apparatus and the supporting plate can be increased.

Figure 5:
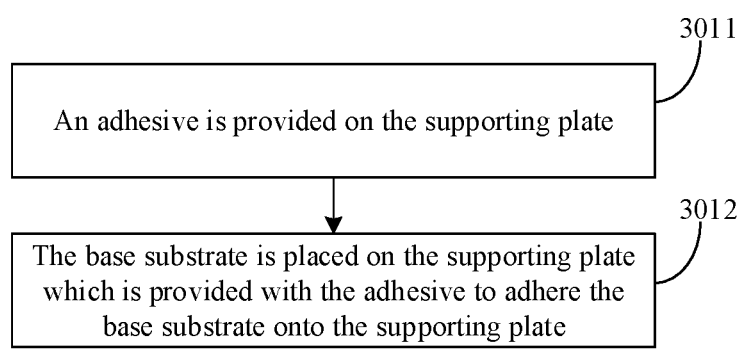
FIG. 5 is a flow chart of adhering the base substrate onto the supporting plate in the embodiment shown in FIG. 3.

As shown in FIG. 5, the step 301 may include the following two sub-steps.

In sub-step 3011, an adhesive is provided on the supporting plate.

The adhesive may be a light curing adhesive or a heat curing adhesive, such as a vinisol (light curing adhesive), an epoxy resin (heat curing adhesive), a resol (heat curing adhesive) or the like. The light curing adhesive may be cured by ultraviolet light (or infrared light), and the heat curing adhesive may be cured by heating. Moreover, the adhesive used in the embodiment of the present disclosure may have solubility, that is, the adhesive may be dissolved by a corresponding dissolving solution so as to facilitate subsequent separation of the base substrate from the supporting plate. Optionally, the adhesive may be a strippable blue glue.

As shown in FIG. 4, the adhesive g is distributed throughout a region q which is occupied by the base substrate on the supporting plate 30. Thus, not only the base substrate can be firmly adhered onto the supporting plate 30, but also the base substrate can be prevented from deforming when the base substrate faces the ground (as in the case of FIG. 1, the base substrate may be deformed due to gravity, resulting in that the center of the base substrate protrudes downward), which otherwise affects the normal operation of various subsequent processes such as an evaporation process. The material of the supporting plate 30 may include a relatively rigid metal such as stainless steel or titanium to prevent the supporting plate 30 from deforming, and the flatness of the material may be within 10 micrometers.

Optionally, the adhesive g may be a whole layer of adhesive, and the adhesive layer can adhere the base substrate onto the supporting plate more firmly.

Optionally, the adhesive g includes a curved adhesive pattern (as in the case of FIG. 4), and the curved adhesive pattern can facilitate subsequent dissolving of the adhesive by the dissolving solution compared to the whole layer of the adhesive.

Optionally, the curved adhesive pattern is an open pattern. The open pattern can further facilitate the dissolving of the adhesive by the dissolving solution (the contact area of the dissolving solution with the adhesive constituting the open pattern is relatively large, and the dissolution speed is relatively fast), which reduces the difficulty of separating the base substrate from the supporting plate. FIG. 4 shows a structure of the open pattern, but the adhesive may also be an open pattern of other shapes, which is not limited in the embodiment of the present disclosure.

It should be noted that, in the embodiment of the present disclosure, a case where the adhesive is provided on the supporting plate is described as an example, but the adhesive may also be provided on the base substrate, which is not limited in the embodiments of the present disclosure.

In sub-step 3012, the base substrate is placed on the supporting plate which is provided with the adhesive to adhere the base substrate onto the supporting plate.

In sub-step 3012:
1) the base substrate is placed on the supporting plate which is provided with the adhesive; and
2) the adhesive is cured to adhere the base substrate onto the supporting plate.

The curing manner may be different depending on the different kind of the adhesive. For example, if the adhesive is a light curing adhesive, it may be cured by ultraviolet light (or infrared light) irradiation. If the adhesive is a heat curing adhesive, it may be cured by heating the adhesive.

After the adhesive is cured, the adhesive can firmly adhere the base substrate onto the supporting plate.

When some structures (such as a thin film transistor or the like) has been formed on the base substrate before step 3012, the side of the base substrate on which the base substrate is not provided with any structure (the side is the back side of the display panel) may be oriented toward the supporting plate. In this way, the back side of the display panel is adhered onto the supporting plate.

Figure 6:
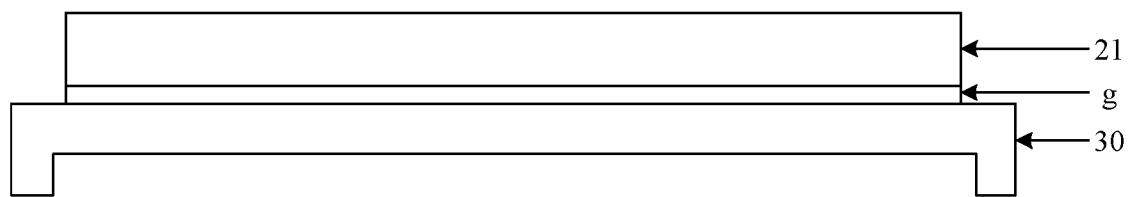
FIG. 6 is a schematic structural diagram of the base substrate and the supporting plate in the embodiment shown in FIG. 3.

At the end of step 301, the structures of the base substrate and the supporting plate may be as shown in FIG. 6, and the adhesive g adheres the base substrate 21 onto the supporting plate 30. Since the adhesive is present between the base substrate and the supporting plate, the base substrate and the supporting plate are not tightly bonded together, and thus are not difficult to separate with each other even with the generation of static electricity.

In step 302, the position of the supporting plate is adjusted so that the side of the supporting plate on which the base substrate is disposed faces the ground.

In the embodiment of the present disclosure, a case where the process apparatus is an evaporating plater is described as an example. Before the supporting plate and the base substrate on the supporting plate are transferred into the evaporating plater, the position of the supporting plate may be adjusted first (the position of the supporting plate may be adjusted by a robot arm), so that the side of the supporting plate on which the base substrate is disposed faces the ground. And thus, it can avoid contamination of the film by particles during evaporation.

When the base substrate is used to manufacture an organic light-emitting diode (OLED) display panel, the evaporating plater may be used to form an electroluminescent layer on the base substrate.

In step 303, the fixing frame is engaged with the clamping groove of the edge of the supporting plate.

After the position of the supporting plate is adjusted, the supporting plate may be transferred into the process apparatus by means of the robot arm, and the fixing frame is engaged with the clamping groove on the edge of the supporting plate. The fixing frame in the process apparatus may include a plurality of fingers which may be engaged on the clamping groove on the edge of the supporting plate to engage the fixing frame with the clamping groove.

In step 304, the supporting plate on which the base substrate is fixed is disposed at a specified position in the process apparatus by means of the fixing frame in the process apparatus.

The supporting plate and the base substrate may be disposed at the specified position in the process apparatus by means of the fixing frame which is engaged with the clamping groove of the supporting plate.

Figure 7:
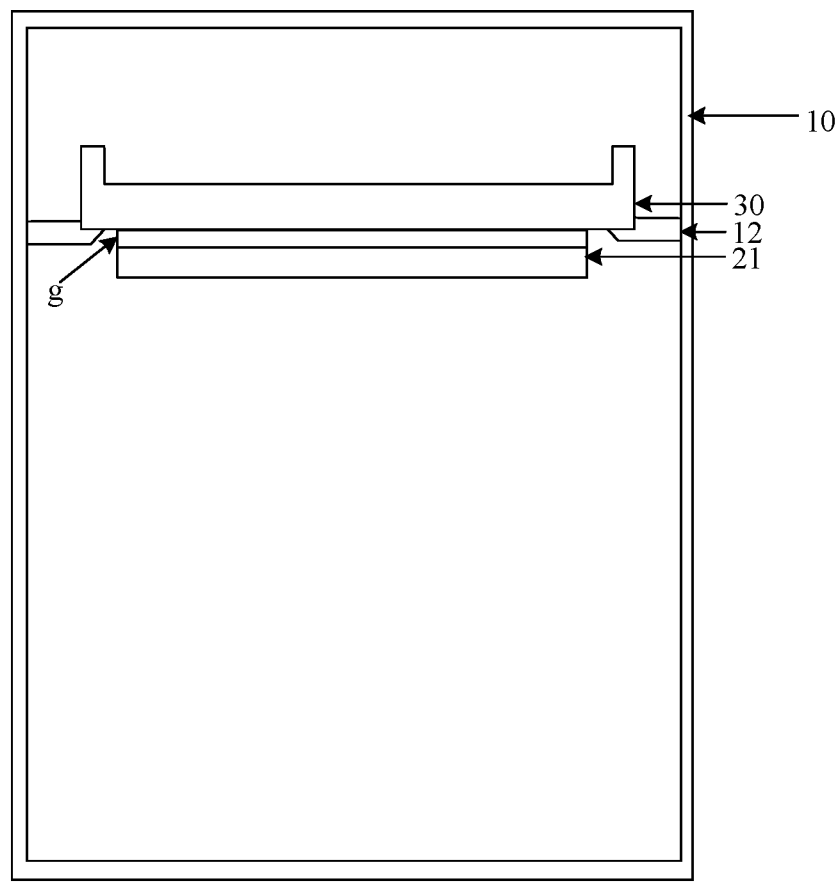
FIG. 7 is a schematic structural diagram of the supporting plate and the base substrate in the process apparatus in the embodiment shown in FIG. 3.

FIG. 7 is a schematic structural diagram of the supporting plate and the base substrate in the process apparatus. As shown in FIG. 7, the adhesive g adheres the base substrate 21 onto the supporting plate 30. The fixing frame 12 fixes the supporting plate in the process apparatus 10. In the embodiment of the present disclosure, compared to the related art that the base substrate is directly fixed on the fixing plate by means of the fixing frame, since the fixing frame 12 is not in direct contact with the base substrate 21, the problem that the base substrate may be damaged when the fixing frame 12 fixes the base substrate 21 (which may directly cause the base substrate to be broken) may be avoided, which improves the protection for the base substrate.

Moreover, the supporting plate on which the base substrate is fixed may be disposed at a specified position in the process apparatus by means of a robot arm, and then the supporting plate is fixed by means of a fixing frame in the process apparatus, which is not limited in the embodiments of the present disclosure.

In step 305, a process corresponding to the process apparatus is performed on the base substrate which is fixed on the supporting plate by means of the process apparatus.

Different process apparatuses may correspond to different processes, for example, the evaporating plater may correspond to an evaporation process.

Figure 8:
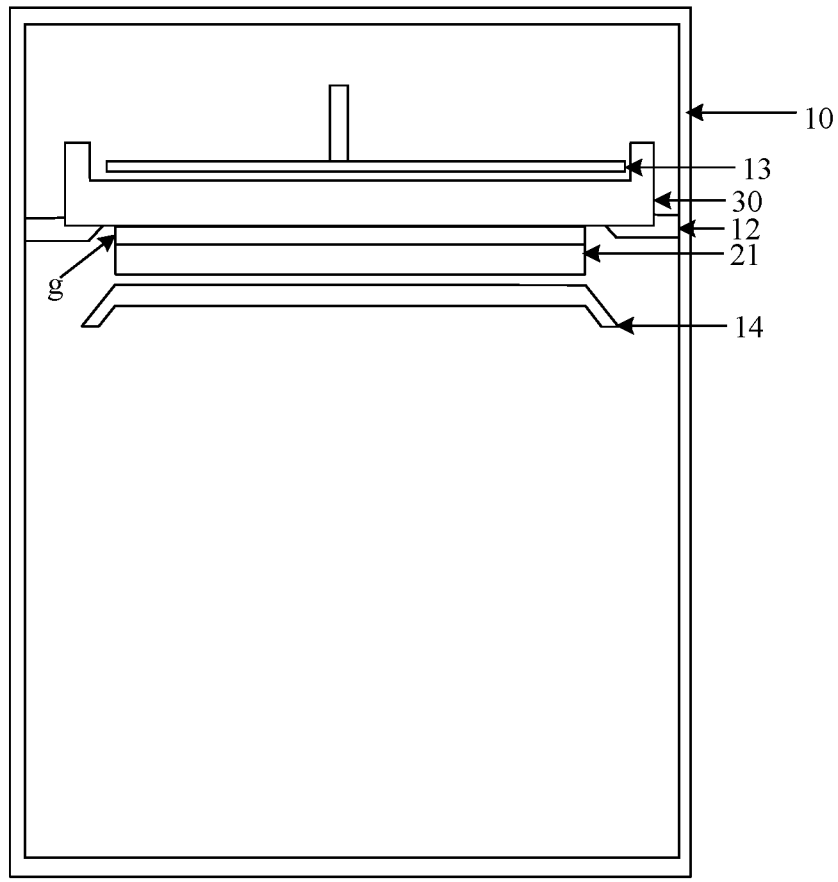
FIG. 8 is a schematic structural diagram of the evaporating plater when performing an evaporation process on the base substrate in the embodiment shown in FIG. 3.

FIG. 8 is a schematic structural diagram of the evaporating plater when performing an evaporation process on the base substrate. As shown in FIG. 7, when performing the evaporation process, a mask (which may be a fine metal mask (FMM)) 14 may be firstly aligned with the base substrate 21 (in the related art, since the bonding between the base substrate and the fixing plate is not strong enough, so that the base substrate may be partially deformed and drooped, which may seriously increase the difficulty of alignment. However, in the present disclosure, the base substrate is firmly adhered onto the supporting plate, and cannot be deformed and drooped, which reduces the difficulty of alignment). During the alignment of the mask 14 with the base substrate 21, the supporting plate 30 and the base substrate 21 can be moved up and down by means of the fixing frame 12 to perform alignment. After the alignment is completed, the magnetic plate 13 is lowered, so that the mask 14 (the mask is usually made of a ferromagnetic material) is closely bonded with the base substrate 21. After evaporation, the supporting plate 30 along with the base substrate 21 is separated from the mask 14, and the evaporation process is completed. Thereafter, the supporting plate and the base substrate 21 may be transferred into the next process apparatus by means of the robot arm for the next manufacturing process.

In step 306, the adhesive is dissolved by a dissolving solution.

After performing the process corresponding to the process apparatus on the base substrate on the supporting plate by means of the process apparatus, the adhesive between the base substrate and the supporting plate may be dissolved by a dissolving solution.

Figure 9:
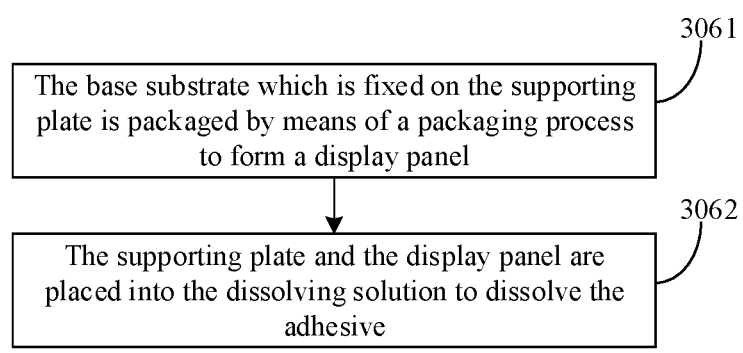
FIG. 9 is a flow chart of dissolving the adhesive in the embodiment shown in FIG. 3.

As shown in FIG. 9, the step 306 may include the following two sub-steps.

In sub-step 3061, the base substrate which is fixed on the supporting plate is packaged by means of a packaging process to form a display panel.

After the various structures on the base substrate are manufactured, the supporting substrate and the base substrate on the supporting plate may be transferred into a packaging device, and the packaging device can bond the cover plate and the base substrate, and perform a process such as packaging (such as laser packaging) to form a display panel.

In sub-step 3062, the supporting plate and the display panel are placed into the dissolving solution to dissolve the adhesive.

After the display panel is manufactured, since the devices inside the display panel are not exposed, the supporting plate and the display panel may be placed in a dissolving solution to dissolve the adhesive.

Figure 10:
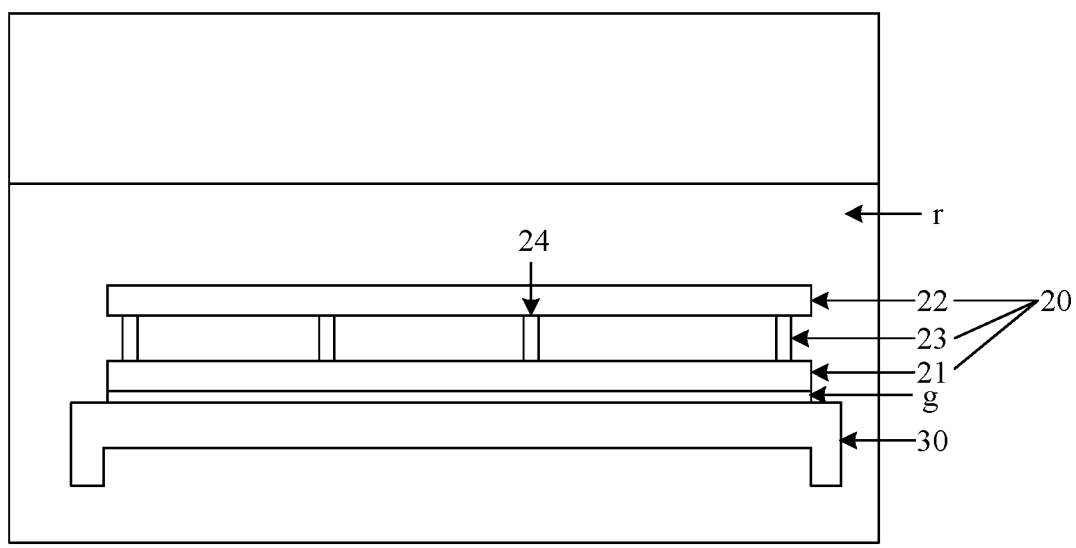
FIG. 10 is a schematic diagram of a supporting plate and a base substrate disposed on the supporting plate in a dissolving solution in the embodiment shown in FIG. 3.

FIG. 10 is a schematic diagram in which the supporting plate and the base substrate disposed on the supporting plate are placed in a dissolving solution. As shown in FIG. 10, the edge of the cover plate 22 and the edge of the base substrate 21 may be adhered by means of an ultraviolet curable adhesive 23, and the interior space between the edge of the cover plate 22 and the edge of the base substrate 21 may be adhered by means of a glass sealant 24. The cover plate 22, the ultraviolet curable adhesive 23, and the base substrate 21 enclose the devices inside the display panel 20, thereby preventing the dissolving solution from damaging the devices inside the display panel 20. The structure of the adhesive g may be as shown in FIG. 3, and the dissolving solution r may be penetrated between the base substrate 21 and the supporting plate 30 to rapidly dissolve the adhesive g.

The dissolving solution may be different depending on the material of the adhesive. For example, the dissolving solution may be water, isopropanol (abbreviation: IPA) or other organic solution.

In the method for manufacturing the display panel according to the embodiment of the present disclosure, the adhesive between the supporting plate and the base substrate may be dissolved after any one of the processes is completed, or the adhesive may be dissolved after the display panel is manufactured, which is not limited in the embodiments of the present disclosure. Dissolving the adhesive after the display panel is manufactured may increase the manufacturing speed of the display panel.

In step 307, the base substrate is separated from the supporting plate.

After the adhesive between the base substrate and the supporting plate is dissolved, the base substrate may be separated from the supporting plate. The supporting plate may be reused subsequently.

In summary, with respect to the method for manufacturing the display panel according to the embodiment of the present disclosure, the base substrate is fixed on the supporting plate, and the supporting plate and the base substrate are transferred together into the process apparatus, so that it is not necessary for the base substrate to fix onto and separate from the fixing plate in the process apparatus, which solves the problem in the related art that, the process of fixing the base substrate onto the fixing plate in the process apparatus and the process of separating the base substrate from the fixing plate in the process apparatus may damage the base substrate, which may result in a low yield of the display panel. Thus, the yield of the display panel may be improved.

Moreover, an embodiment of the present disclosure further provides a display panel, and the structure of the display panel may be referred to the display panel 20 shown in FIG. 10.

Moreover, an embodiment of the present disclosure further provides a display device, and the display device may include the display panel 20 shown in FIG. 10.

Moreover, an embodiment of the present disclosure further provides a supporting plate, and the structure of the supporting plate may be referred to FIG. 4.

It should be noted that in the accompanying drawings, for clarity of the illustration, the dimension of the layers and areas may be scaled up. It may be understood that when an element or layer is described as being "above" another element or layer, the described element or layer may be directly on the other element or layer, or at least one intermediate layer may be arranged between the described element or layer and the other element or layer. In addition, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the each of the two layers or elements. In the whole specification described above, like reference numerals denote like elements.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

The invention claimed is:

1. A method for manufacturing a display panel, comprising:
    fixing a base substrate on a supporting plate, wherein an edge of the supporting plate is provided with a clamping groove;
    engaging a fixing frame in a process apparatus with the clamping groove;
    fixing the supporting plate on which the base substrate is fixed at a specified position in the process apparatus by means of the fixing frame; and
    forming the display panel by using the process apparatus to process the base substrate which is fixed on the supporting plate.

2. The method according to claim 1, wherein fixing the base substrate on the supporting plate comprises:
    adhering the base substrate onto the supporting plate.

3. The method according to claim 2, wherein adhering the base substrate onto the supporting plate comprises:
    providing an adhesive on the supporting plate; and
    placing the base substrate on the supporting plate which is provided with the adhesive so that the base substrate is adhered onto the supporting plate.

4. The method according to claim 3, wherein after using the process apparatus to process the base substrate which is fixed on the supporting plate, the method further comprises:
    dissolving the adhesive by means of a dissolving solution; and
    separating the base substrate from the supporting plate.

5. The method according to claim 3, wherein the adhesive is any one of a light curing adhesive and a heat curing adhesive, and placing the base substrate on the supporting plate which is provided with the adhesive so that the base substrate is adhered onto the supporting plate comprises:
    placing the base substrate on the supporting plate which is provided with the adhesive; and
    curing the adhesive to adhere the base substrate onto the supporting plate.

6. The method according to claim 3, wherein the adhesive is distributed throughout a region which is occupied by the base substrate on the supporting plate.

7. The method according to claim 6, wherein the adhesive comprises a curved adhesive pattern.

8. The method according to claim 7, wherein the curved adhesive pattern is a non-enclosed pattern which is configured to increase contact area of a dissolving solution with the adhesive constituting the non-enclosed pattern.

9. The method according to claim 1, wherein after using the process apparatus to process the base substrate which is fixed on the supporting plate, the method further comprises:
    packaging the base substrate which is fixed on the supporting plate by means of a packaging process to form the display panel; and
    placing the supporting plate and the display panel into the dissolving solution to dissolve the adhesive.

10. The method according to claim 1, wherein after using the process apparatus to process the base substrate which is fixed on the supporting plate, the method further comprises:
    removing the base substrate as processed and the supporting plate from the process apparatus.

11. The method according to claim 1, wherein the process apparatus is an evaporating plater, and before disposing the supporting plate on which the base substrate is fixed at a specified position in a process apparatus, the method further comprises:
    adjusting a position of the supporting plate so that a side of the supporting plate on which the base substrate is disposed faces ground.

12. The method according to claim 1, wherein the method further comprises:
    providing an adhesive on the supporting plate, wherein the adhesive is any one of a light curing adhesive and a heat curing adhesive, the adhesive is distributed throughout a region which is occupied by the base substrate on the supporting plate, and the adhesive comprises a curved adhesive pattern which is a non-enclosed pattern configured to increase contact area of a dissolving solution with the adhesive constituting the non-enclosed pattern;
    placing the base substrate on the supporting plate which is provided with the adhesive;
    curing the adhesive to adhere the base substrate onto the supporting plate;
    using the process apparatus to process the base substrate which is fixed on the supporting plate;
    packaging the base substrate which is fixed on the supporting plate by means of a packaging process to form the display panel; and
    placing the supporting plate and the display panel into a dissolving solution to dissolve the adhesive.

* * * * *